US009534314B2

(12) United States Patent
Choi et al.

(10) Patent No.: US 9,534,314 B2
(45) Date of Patent: Jan. 3, 2017

(54) SINGLE CRYSTAL INGOT, APPARATUS AND METHOD FOR MANUFACTURING THE SAME

(71) Applicant: LG SILTRON INCORPORATED, Gumi-si, Gyeongsangbuk-do (KR)

(72) Inventors: Il Soo Choi, Gumi-si (KR); Jin Woo Ahn, Daejeon (KR); Hak Eui Wang, Gumi-si (KR); Yong Jin Kim, Gumi-si (KR)

(73) Assignee: LG SILTRON INCORPORATED, Gumi, Gyeongsangbuk-Do (KR)

( * ) Notice: Subject to any disclaimer, the term of this patent is extended or adjusted under 35 U.S.C. 154(b) by 302 days.

(21) Appl. No.: 13/914,927

(22) Filed: Jun. 11, 2013

(65) Prior Publication Data

US 2014/0205837 A1 Jul. 24, 2014

(30) Foreign Application Priority Data

Jan. 23, 2013 (KR) ........................ 10-2012-0007360
Jan. 23, 2013 (KR) ........................ 10-2012-0007361

(51) Int. Cl.

*C30B 15/30* (2006.01)
*C30B 15/22* (2006.01)
*C30B 29/06* (2006.01)
*C30B 15/14* (2006.01)

(52) U.S. Cl.

CPC ............... *C30B 15/22* (2013.01); *C30B 15/14* (2013.01); *C30B 29/06* (2013.01); *Y10T 117/1068* (2015.01); *Y10T 428/2976* (2015.01)

(58) Field of Classification Search

CPC ............................... C30B 15/30; C30B 15/305
See application file for complete search history.

(56) References Cited

U.S. PATENT DOCUMENTS 6,059,874 A * 5/2000 Von Ammon .......... C30B 15/30 117/13
2011/0214605 A1* 9/2011 Matsumoto ........... C30B 15/305 117/15

FOREIGN PATENT DOCUMENTS

JP H05-004895 A 1/1993
JP 2008-162809 A 1/2008
JP 2008-254958 A 10/2008
KR 10-2013-0017908 A 2/2013

* cited by examiner

*Primary Examiner* — Robert M Kunemund
(74) *Attorney, Agent, or Firm* — KED & Associates, LLP

(57) ABSTRACT

Disclosed is a single-crystal ingot manufacturing apparatus, which includes a crucible in which a melt is accommodated, a heater configured to heat the crucible, a heat shield member configured to shield radiant heat from the heater and the melt, and a neck cover configured to encompass a seed crystal unit above the crucible with being introduced into an opening of the heat shield member, the radiant heat being not shielded in the opening, the neck cover being vertically moved in linkage to vertical movement of the seed crystal unit within a predetermined range.

12 Claims, 17 Drawing Sheets

(a)

(b)

SINGLE CRYSTAL INGOT, APPARATUS AND METHOD FOR MANUFACTURING THE SAME

CROSS REFERENCE TO RELATED APPLICATION

This application claims priority under 35 U.S.C. §119 to Korean Patent Application Nos. 10-2013-0007360 and 10-2013-0007361, filed in Korea on Jan. 23, 2013, which are hereby incorporated in their entireties by reference as if fully set forth herein.

TECHNICAL FIELD

Embodiments relate to a single-crystal ingot, an apparatus and method for manufacturing the same.

BACKGROUND

FIG. 1 is a view illustrating a conventional single-crystal ingot manufacturing apparatus.

The single-crystal ingot manufacturing apparatus illustrated in FIG. 1 includes a crucible 10, a seed crystal 30, heat-shields 42 and 44, a heater 50, a wire 62, and a pulling motor 64.

With a silicon single-crystal manufacturing method using a Czochralski process, after the crucible 10 is filled with polysilicon, the crucible 10 is heated by the heater 50 to melt the polysilicon, which results in silicon melt 20. Next, the seed crystal 30 is lowered to come into contact with the silicon melt 20, and thereafter is pulled upward by rotating the wire 62 connected to the seed crystal 30 using the pulling motor 64 so as to subsequently form a neck portion, a shoulder portion, and a diameter portion (or a straight body) having a predetermined diameter of an ingot. In this way, growth of the single-crystal ingot is completed. In this case, the heat-shields 42 and 44 serve to shield radiant heat generated from the silicon melt 20, the crucible 10, and the heater 50.

Slip dislocation occurs in a lower end of the seed crystal 30 at a high density from thermal shock due to a rapid temperature difference when the seed crystal 30 comes into contact with the silicon melt 20. A necking operation of removing the slip dislocation is essential, in order to grow a dislocation-free silicon single-crystal ingot. The necking operation developed by Dash creates an elongated neck portion having a diameter within a range of about 3 mm to 4 mm and a length within a range of about 100 mm or more.

The neck portion having a small diameter within a range of 3 mm to 4 mm may be damaged with increasing diameter and weight of the silicon single-crystal ingot during growth, which causes serious accidents, such as fall of the single-crystal ingot, etc. In particular, a greater diameter and weight of the single-crystal ingot may worsen damage to the neck portion.

SUMMARY

Embodiments provide a single-crystal ingot having a dislocation-free and large-diameter neck portion.

Further, embodiments provide an apparatus and method for manufacturing the single-crystal ingot.

A single-crystal ingot manufacturing apparatus may include a crucible in which a melt is accommodated; a heater configured to heat the crucible; a heat shield member configured to shield radiant heat from the heater and the melt; and a neck cover configured to encompass a seed crystal unit above the crucible with being introduced into an opening of the heat shield member, the radiant heat being not shielded in the opening, the neck cover being vertically moved in linkage to vertical movement of the seed crystal unit within a predetermined range.

The apparatus may further include a guide unit to guide a vertical movement path of the neck cover within the predetermined range.

Both ends of the guide unit may define the predetermined range, and the guide unit has a stopper protruding inward from one of both ends thereof that is closer to the crucible, the stopper serving to restrict the vertical movement path.

The neck cover may have a top portion consisting of a first region and a second region, wherein the first region is supported by the seed crystal unit and has a through-hole, through which a wire connected to the seed crystal unit passes, and the second region protrudes outward from an edge of the top portion so as to be caught by the stopper; a lateral portion extending from the top portion; and a bottom portion protruding inward from the lateral portion and configured to encompass the seed crystal unit, the bottom portion defining an opening for entrance/exit of the seed crystal unit.

The bottom portion of the neck cover and the heat shield member may form a heat shield member when the protrusion of the second region is caught by the stopper.

The apparatus may further have a controller to control growth of a neck portion of a single-crystal ingot by dipping the seed crystal unit in the melt during formation of the heat shield member.

The top portion and the lateral portion of the neck cover may be formed of a metal or metal oxide.

The bottom portion of the neck cover may be formed of a material having an M/I (monomer to initiator) of 1.0 ppma or less.

The neck cover may include at least one inner wall layer; and at least one outer wall layer placed on the at least one inner wall layer to prevent transmission of heat emitted from the interior of the neck cover.

A void ratio of the at least one outer wall layer may be greater than a void ratio of the at least one inner wall layer.

The at least one outer wall layer may include bubbles, and the at least one inner wall layer may include no bubbles.

Each of the at least one inner wall layer and the at least one outer wall layer may be formed of $SiO_2$.

A single-crystal ingot manufacturing method, which is performed by a single-crystal ingot manufacturing apparatus comprising: a crucible in which a melt is accommodated; a heater configured to heat the crucible; a heat shield member configured to shield radiant heat from the heater and the melt; and a neck cover configured to encompass a seed crystal unit above the crucible with being introduced into an opening of the heat shield member, the radiant heat being not shielded in the opening, the neck cover being vertically moved in linkage to vertical movement of the seed crystal unit within a predetermined range, may include producing the melt; lowering the seed crystal unit and the neck cover together within the predetermined range; growing a neck portion of a single-crystal ingot by more lowering the seed crystal unit in a state in which the lowered neck cover is kept stationary to dip the seed crystal unit in the melt, and thereafter pulling the seed crystal unit up; and pulling the seed crystal unit and the neck cover up together, after growing the neck portion.

A single-crystal ingot, which is manufactured by a single-crystal ingot manufacturing apparatus comprising: a crucible in which a melt is accommodated; a heater configured to heat the crucible; a heat shield member configured to shield radiant heat from the heater and the melt; and a neck cover configured to encompass a seed crystal unit above the crucible with being introduced into an opening of the heat shield member, the radiant heat being not shielded in the opening, the neck cover being vertically moved in linkage to vertical movement of the seed crystal unit within a predetermined range, may include a neck portion which is grown as the seed crystal unit encompassed by the neck cover is dipped in the melt, the neck portion being free from dislocation and having a diameter of 5.5 mm or more.

The ingot may further includes a shoulder portion grown below the neck portion; and a diameter portion grown below the shoulder portion and having a diameter of 300 mm or more.

A single-crystal ingot manufacturing apparatus may include a crucible in which a melt is accommodated; a heater configured to heat the crucible; a heat shield member configured to shield radiant heat from the heater and the melt; and a neck cover configured to encompass a seed crystal above the crucible with being introduced into an opening of the heat shield member, the radiant heat being not shielded in the opening, wherein the neck cover includes: at least one inner wall layer; and at least one outer wall layer placed on the at least one inner wall layer to prevent transmission of heat emitted from the interior of the neck cover.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Hereinafter, embodiments will be described in detail with reference to the accompanying drawings in the best manner to improve understanding of the embodiments. However, various modifications of the embodiments are possible, and the technical sprit of the embodiments is not constructed as being limited to the embodiments. The embodiments of the present disclosure are provided to explain the disclosure to those skilled in the art.

Figure 2:
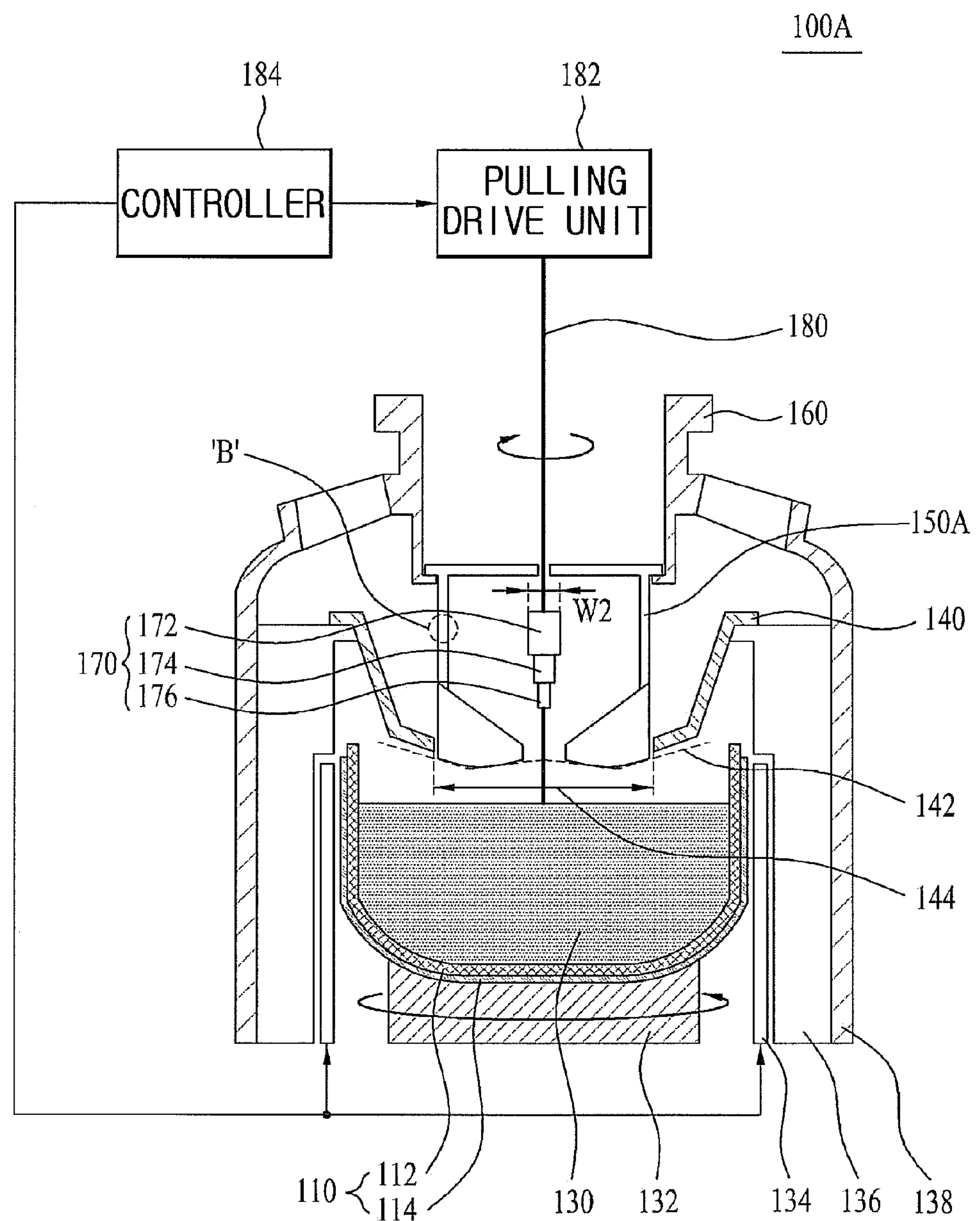
FIG. 2 is a view illustrating a single-crystal ingot manufacturing apparatus according to an embodiment.

FIG. 2 is a view illustrating a single-crystal ingot manufacturing apparatus 100A according to an embodiment.

Referring to FIG. 2, the single-crystal ingot manufacturing apparatus 100A includes a crucible 110, a rotatable support shaft 132, a heater 134, an insulator 136, a reaction chamber 138, a heat shield member 140, a neck cover 150A, a guide unit 160, a seed crystal unit 170, a wire 180, a pulling drive unit 182, and a controller 184.

The single-crystal ingot manufacturing apparatus 100A according to the embodiment is used to grow a single-crystal ingot by a Czochralski process.

The reaction chamber 138 serves to accommodate the crucible 110, the rotatable support shaft 132, the heater 134, the insulator 136, the heat shield member 140, the neck cover 150A, the guide unit 160, the seed crystal unit 170, and the wire 180.

The crucible 110 serves to accommodate a melt for growth of a single-crystal ingot. The crucible 110, in which a silicon melt 130 is accommodated, may have a dual configuration comprised of a quartz inner wall 112 and a graphite or carbon outer wall 114. The heater 134 serves to heat the crucible 110 under control of the controller 184.

The seed crystal unit 170 may consist of a seed crystal weight 172, a seed crystal chuck 174, and a seed crystal 176, but the embodiment is not limited thereto. Of course, various modifications and applications are possible by those skilled in the art.

When the seed crystal 176 is brought into contact with or is dipped in the silicon melt 130, the seed crystal 176 undergoes shaking due to, e.g., vibration generated when the seed crystal 176 is rotated by the pulling drive unit 182. This shaking causes rotation center axes of the pulling drive unit 182 and the seed crystal 176 to deviate from each other. To prevent this problem, the seed crystal weight 172 is fixed and coupled to a distal end of the wire 180 and serves to add weight to the wire 180. The seed crystal chuck 174 is coupled to the bottom of the seed crystal weight 172 such that the seed crystal 176 is partially inserted into and coupled to the seed crystal chuck 174. The seed crystal 176 is detachably coupled at one end thereof to the seed crystal chuck 174 and a lower end of the seed crystal 176 is dipped in the silicon melt 130.

The heat shield member 140 serves to shield transfer of radiant heat from the heater 134 and the silicon melt 130 to a single-crystal ingot. That is, the heat shield member 140 shields a heat transfer path to the single-crystal ingot, thereby preventing the single-crystal ingot from being heated by radiant heat. In this way, the heat shield member 140 has a great effect on cooling of the single-crystal ingot. Moreover, the heat shield member 140 serves to restrict a change in the temperature of the melt 130. To this end, the heat shield member 140 may be arranged between the single-crystal ingot and the crucible 110 so as to surround the single-crystal ingot. In addition, the heat shield member 140 is provided with an opening 144 corresponding to an inner diameter of the heat shield member 140 facing a surface of the melt 130. The opening 144 corresponds to the area in which radiant heat of the melt 130 is transferred upward without being shielded.

The insulator 136 serves to prevent transfer of heat from the heater 134 to the outside of the reaction chamber 138. For example, the insulator 136 may be formed of felt.

The wire 180 is released by the pulling drive unit 182 under control of the controller 184 until a tip end of the seed crystal 176 is brought into contact with or is dipped in approximately the center of the surface of the melt 130. The rotatable support shaft 132 of the crucible 110 is rotated in a direction designated by the arrow by a support-shaft drive unit (not shown). At the same time, the pulling drive unit 182 rotates the seed crystal 176 in a direction designated by the arrow and is pulled by the wire 180, which enables growth of a single-crystal ingot. In this case, the single-crystal ingot in the form of a cylindrical cone may be completed by adjusting a pulling speed V and a temperature gradients G and ΔG of the single-crystal ingot.

Figure 3:
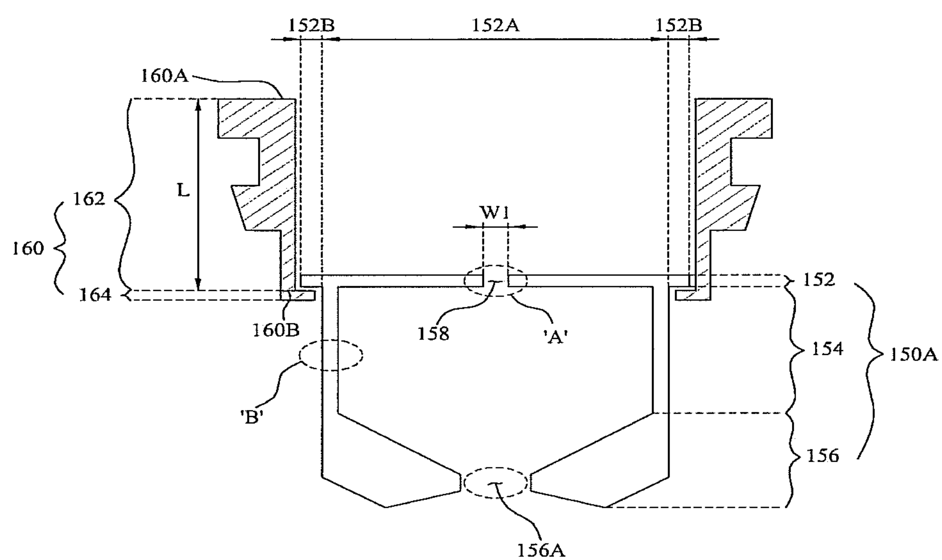
FIG. 3 is an enlarged sectional view illustrating a neck cover and a guide unit of FIG. 2, according to the embodiment.

FIG. 3 is an enlarged sectional view illustrating the neck cover 150A and the guide unit 160 of FIG. 2, according to the embodiment.

According to the embodiment, the neck cover 150A encompasses the seed crystal unit 170 above the crucible 110, and is vertically moved in linkage to vertical movement of the seed crystal unit 170 within a predetermined range. The guide unit 160 serves to guide a vertical movement path of the neck cover 150A within the predetermined range.

Referring to FIG. 2 and FIG. 3, the guide unit 160 includes a body 162 and a stopper 164. Both ends 160A and 160B of the body 162 define a predetermined range L. The stopper 164 protrudes inward from one end 160B, among both ends 160A and 160B defining the predetermined range L, that is located closer to the crucible 110. That is, the stopper 164 serves to limit a vertical movement path of the neck cover 150A. Although the guide unit 160 may be integrated with the reaction chamber 138 as illustrated in FIG. 2, the embodiment is not limited thereto. That is, the guide unit 160 may be separately formed from the reaction chamber 138, and may be employed in various structures to guide a vertical movement path of the neck cover 150A.

The neck cover 150A consists of a top portion 152, a lateral portion 154, and a bottom portion 156. The top portion 152 may be divided into first and second regions 152A and 152B. The first region 152A is supported by the seed crystal unit 170 and has a through-hole 158, through which the wire 180 connected to the seed crystal unit 170 passes. To ensure that the first region 152A is supported by the seed crystal unit 170, a width W of the through-hole 158 is less than a width W2 of an upper end of the seed crystal weight 172. The second region 152B may be a protrusion extending outward from an edge of the top portion 152 so as to be caught by the stopper 164 when the neck cover 150A is lowered.

As described above, since the second region 152B protruding from the top portion 152 is caught by the stopper 164 protruding from the guide unit 160, it is possible to prevent the neck cover 150A from being lowered beyond the predetermined range L. However, the stopper 164 and the second region 152B are not limited to the above described protrusion shapes illustrated in FIG. 2 and FIG. 3, and may be embodied in various shapes to prevent excessive descent of the neck cover 150A.

The lateral portion 154 extends from an end of the first region 152A of the top portion 152. The bottom portion 156 protrudes inward from the lateral portion 154 so as to encompass the seed crystal unit 170. The bottom portion 156 defines an opening 156A for entrance/exit of the seed crystal unit 170. In this case, a thickness of the bottom portion 156 may be reduced inward from the lateral portion 154. The neck cover 150A may be introduced into the opening 144 that is defined by the heat shield member 140. To this end, a width of the bottom portion 156 may be equal to or less than a width of the opening 144.

Figure 4:
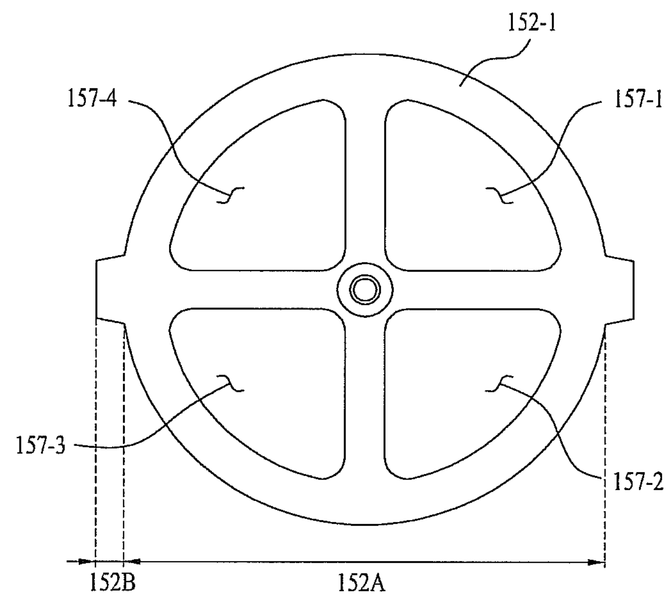
FIG. 4(*a*) is a plan view illustrating a top portion illustrated in FIG. 3, and FIG. 4(*b*) is an enlarged sectional view illustrating the portion 'A' of FIG. 3.
Figure 4:
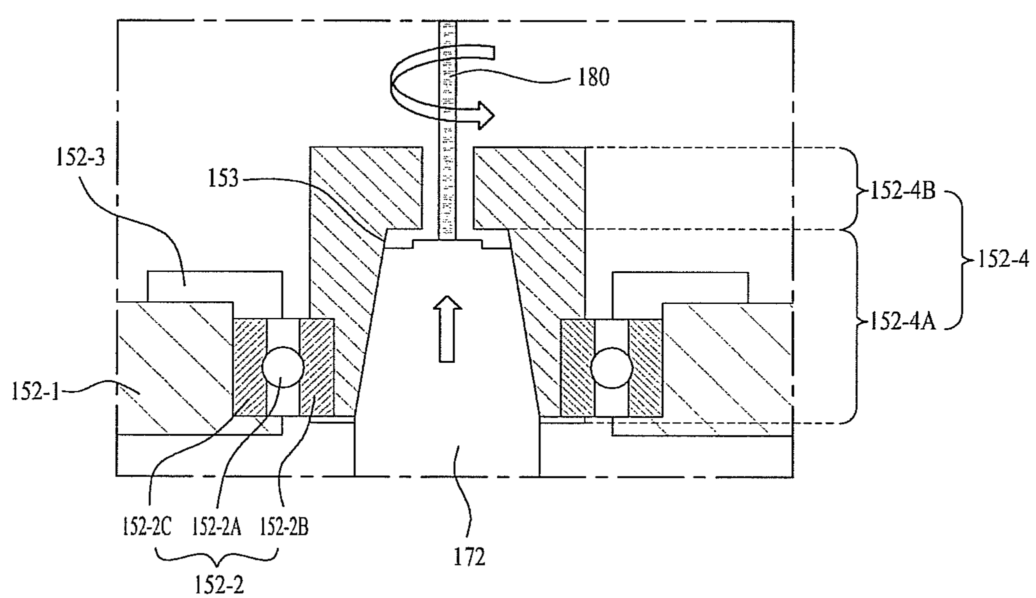

FIG. 4(*a*) is a plan view illustrating the top portion 152 illustrated in FIG. 3, and FIG. 4(*b*) is an enlarged sectional view illustrating the portion 'A' of FIG. 3.

Referring to FIG. 3, FIG. 4(*a*) and FIG. 4(*b*), the first region 152A of the top portion 152 has the wire hole 158 for penetration of the wire 160. In addition, the top portion 152 includes a support plate 152-1, a bearing 152-2, and a bushing 152-4.

The bearing 152-2 is located around the bushing 152-4, and consists of a bearing ball 152-2A, an inner race 152-2B and an outer race 152-2C.

The bushing 152-4 defines the wire hole 158 and is separated from the wire 180. Thereby, the bushing 152-4 is free from rotation even if the wire 180 is rotated before the seed crystal weight 172 is introduced into the bushing 152-4.

After the seed crystal weight 172 is introduced into the bushing 152-4 as illustrated in FIG. 4(*b*), the bushing 152-4 is rotated together with the inner race 152-2B of the bearing 152-2, while being integrated with the seed crystal weight 172, thereby being simultaneously moved vertically upward by the seed crystal weight 172. That is, the neck cover 150A may be moved vertically upward together with the seed crystal unit 170.

To realize the above-described operation, the bushing 152-4 may consist of a first segment 152-4A and a second segment 152-4B. The first segment 152-4A is a part into which an upper portion of the seed crystal weight 172 is introduced, and the second segment 152-4B is a part that is arranged above the first segment 152-4A, with being enlarged from and integrated with the first segment 152-4A, and defines the wire hole 158.

In this case, an inner wall 153 of the first segment 152-4A is tapered upward to assist the upper portion of the seed crystal weight 172 in entering and being seated in the bushing 152-4. That is, the tapered inner wall 153 of the first segment 152-4A serves to restrict vibration when an upper end of the seed crystal weight 172 is coupled to the bushing 152-4 of the top portion 152 and to enable accurate positioning, i.e. accurate coupling.

The top portion 152, as illustrated in FIG. 4(*b*), may further include a bearing cover 152-3. The bearing cover 152-3 may be arranged across the top of the support plate 152-1 and the top of the bearing 152-2.

In general, an oxygen concentration is one of major quality options of a silicon single-crystal wafer, and various factors, such as rotation of the crucible 110, pressure inside the chamber 138, etc., may be adjusted in order to control the oxygen concentration during growth of silicon single-crystals. In particular, to control the oxygen concentration, in the single-crystal ingot manufacturing apparatus 100A, carrier gas, such as argon gas, is injected into the chamber 138 from the top thereof and is discharged from the bottom of the chamber 138. In this case, as illustrated in FIG. 4(*a*), the support plate 152-1 may have a plurality of gas holes 157-1 to 157-4 for allowing flow of the carrier gas.

When the protrusion in the second region 152B of the top portion 152 of the neck cover 150A having the above-described configuration is caught by the stopper 164, the bottom portion 156 of the neck cover 150A and the heat shield member 140 may define a heat shield member 142.

To realize the above-described role, the top portion 152 and the lateral portion 154 of the neck cover 150A may be formed of a metal that is stable at a high temperature, such as stainless steel, or may be formed of a metal oxide. In addition, the bottom portion 156 of the neck cover 150A may be formed of a material that has high thermal reflectivity, high temperature stability, and high purity. The bottom portion 156 may be formed of a material having an M/I (monomer to initiator) of 1.0 ppma or less, for example, Pyrolytic Graphite Coated Graphite (PGCG) or Pyrolytic Boron Nitride Coated Graphite (PBNCG).

Figure 5:
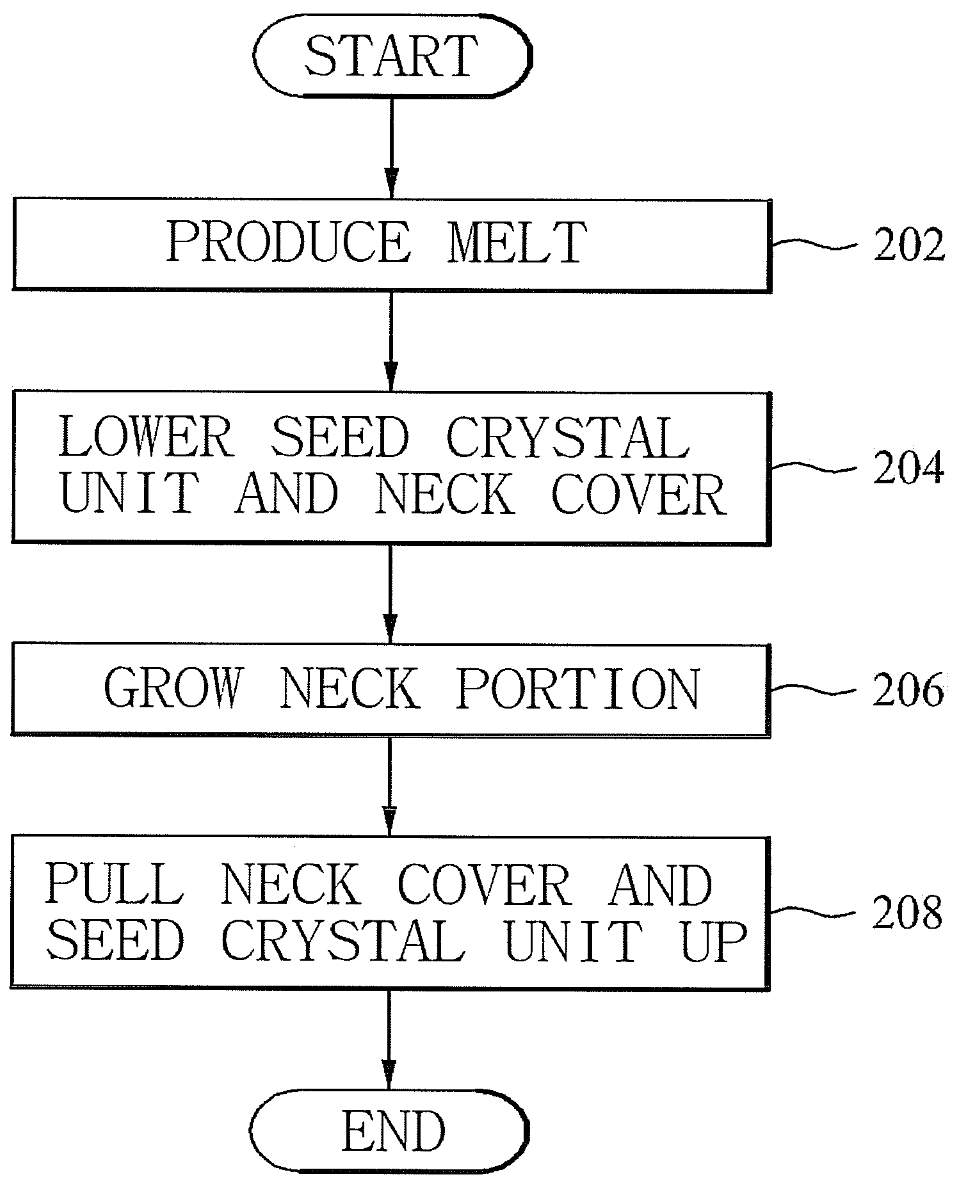
FIG. 5 is a flowchart explaining a method for forming a large-diameter dislocation-free silicon single-crystal neck portion according to an embodiment.

FIG. 5 is a flowchart explaining a method for forming a large-diameter dislocation-free silicon single-crystal neck portion according to an embodiment.

The method for forming a large-diameter dislocation-free silicon single-crystal neck portion as illustrated in FIG. 5 may be performed by the single-crystal ingot manufacturing apparatus 100A as illustrated in FIG. 2.

FIG. 6A to FIG. 6H are views of the single-crystal ingot manufacturing apparatus 100A illustrated in FIG. 2, illustrating movement of the neck cover 150A based on the implementation of the method of FIG. 5.

Figure 6A:
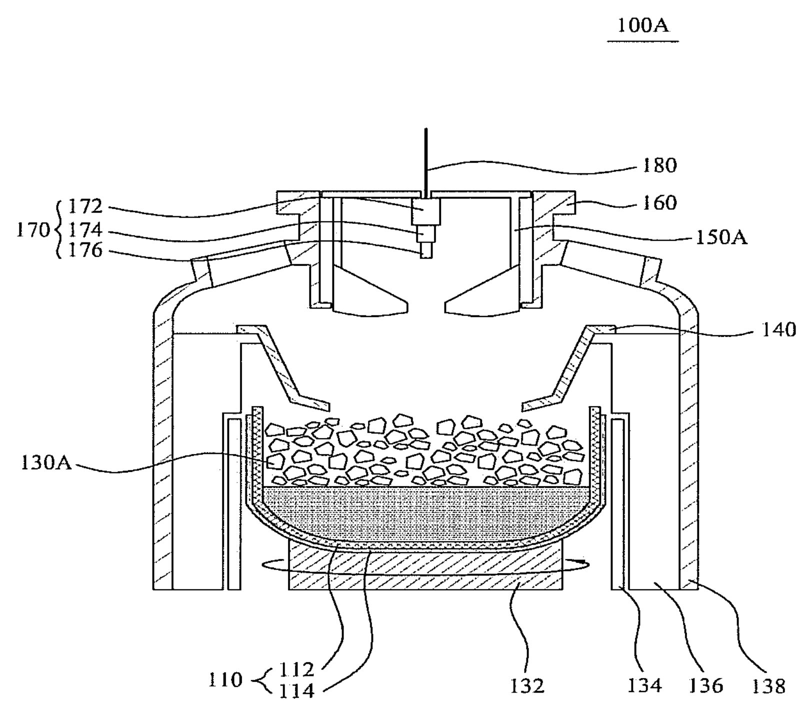
FIG. 6A to FIG. 6H are views of the single-crystal ingot manufacturing apparatus illustrated in FIG. 2, illustrating movement of the neck cover via implementation of the method of FIG. 5.
Figure 6B:
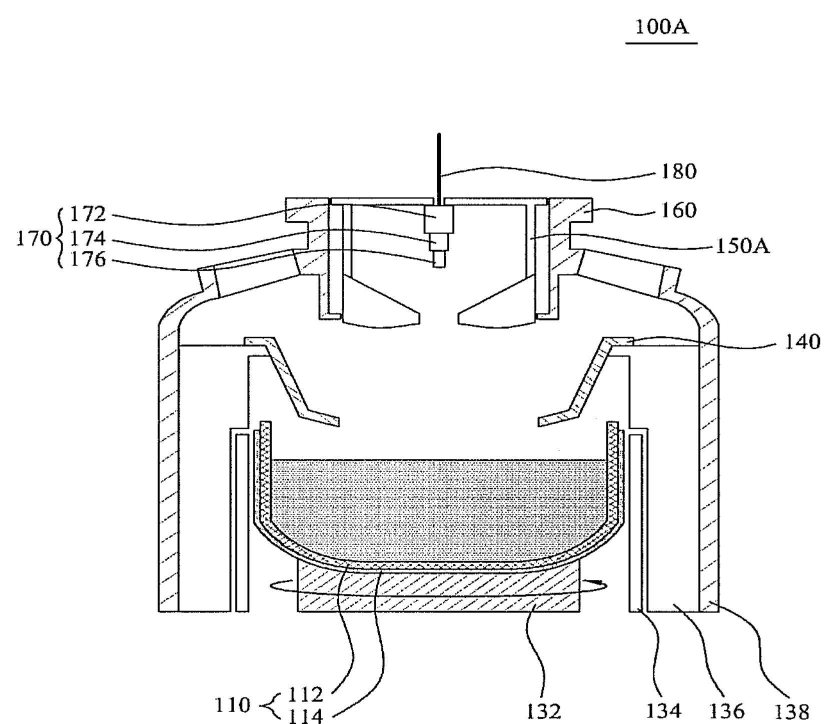

As illustrated in FIG. 6A, a high-purity multi-crystalline silicon material 130A is poured into the crucible 110, and the crucible 110 is heated to a temperature equal to or greater than a melting temperature by the heater 134. Thereby, the multi-crystalline material 130A is changed into the silicon melt 130 as illustrated in FIG. 6B (Operation 202).

Figure 6C:
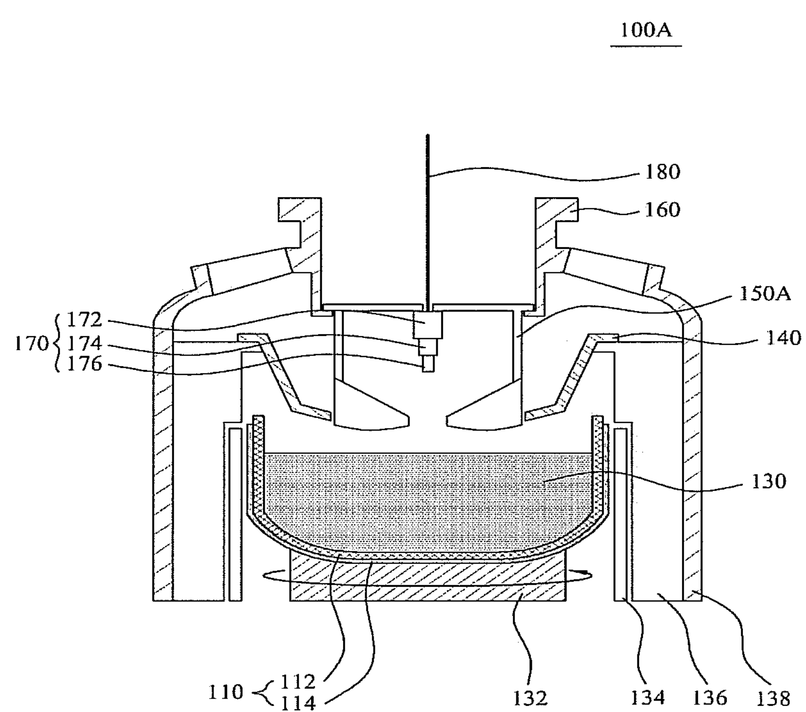

After Operation 202, as illustrated in FIG. 6C, both the seed crystal unit 170 and the neck cover 150A are lowered by a predetermined range L, such that the neck cover 150A is set to a position for a following necking operation (Operation 204). As illustrated in FIG. 6A and FIG. 6B, a bottom surface of the top portion 152 of the neck cover 150A is supported and fixed by the seed crystal unit 170 before the seed crystal unit 170 is lowered. However, during lowering of the seed crystal unit 170, as illustrated in FIG. 6C, the neck cover 150A and the seed crystal unit 170 are simultaneously lowered in cooperation with each other by the predetermined range L.

Figure 6D:
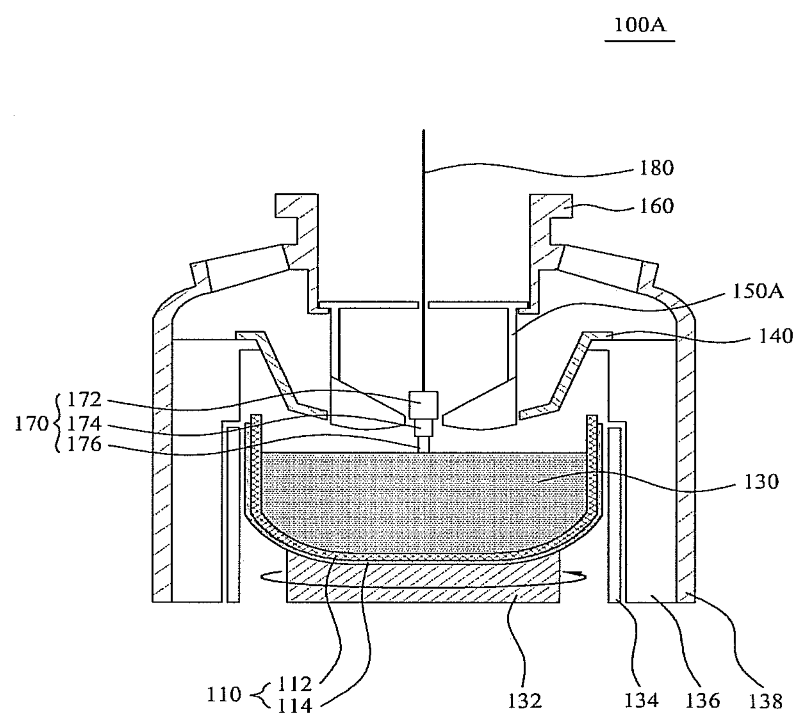
Figure 6E:
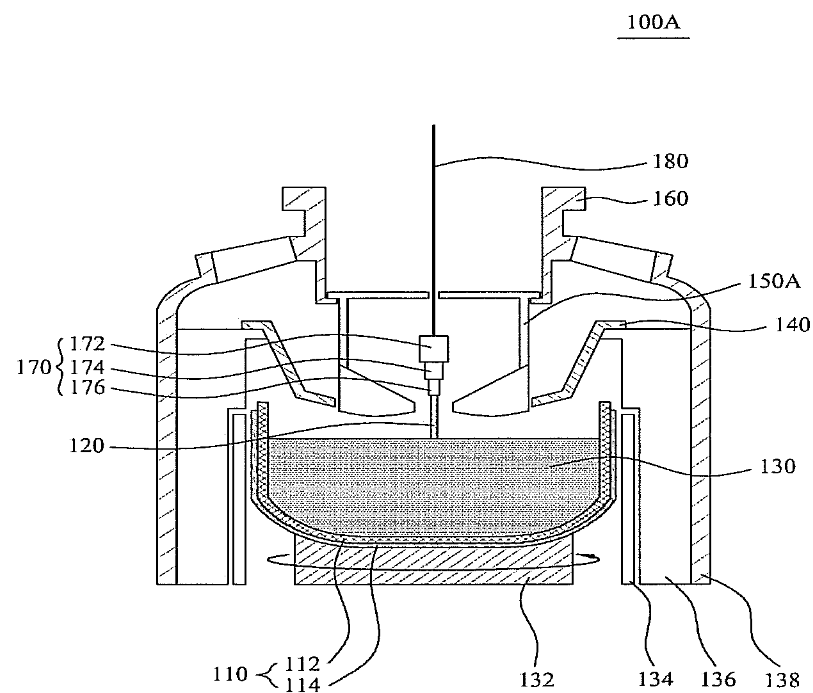

After Operation 204, in a state in which the heat shield member 142 is created as illustrated in FIG. 2, the pulling drive unit 182 more and more lowers the seed crystal unit 170 using the wire 180 as illustrated in FIG. 6D under control of the controller 184 so as to dip the seed crystal unit 170 in the melt 130. Thereafter, as illustrated in FIG. 6E, the pulling drive unit 182 pulls the seed crystal unit 170 up, to grow a neck portion (Operation 206). During implementation of Operation 206, the neck cover 150A is kept stationary by the stopper 164. During growth of the neck portion, the controller 184 may control heating by the heater 134 such that a temperature between the bottom portion 156 of the neck cover 150A and the melt 130 is 1000° C. or more, more particularly 1200° C. or more. In addition, during growth of the neck portion, the controller 184 may control heating by the heater 134 in such a way that thermal stress due to temperature distribution between the bottom portion 156 of the neck cover 150A and the melt 130 is 2 Mpa or less, more particularly 1.5 Mpa. In addition, during growth of the neck portion, the seed crystal unit 170, as illustrated in FIG. 6E, may be pulled up at a speed of 4.0 mm/min or less, more particularly, 2.0 mm/min or less.

Figure 6F:
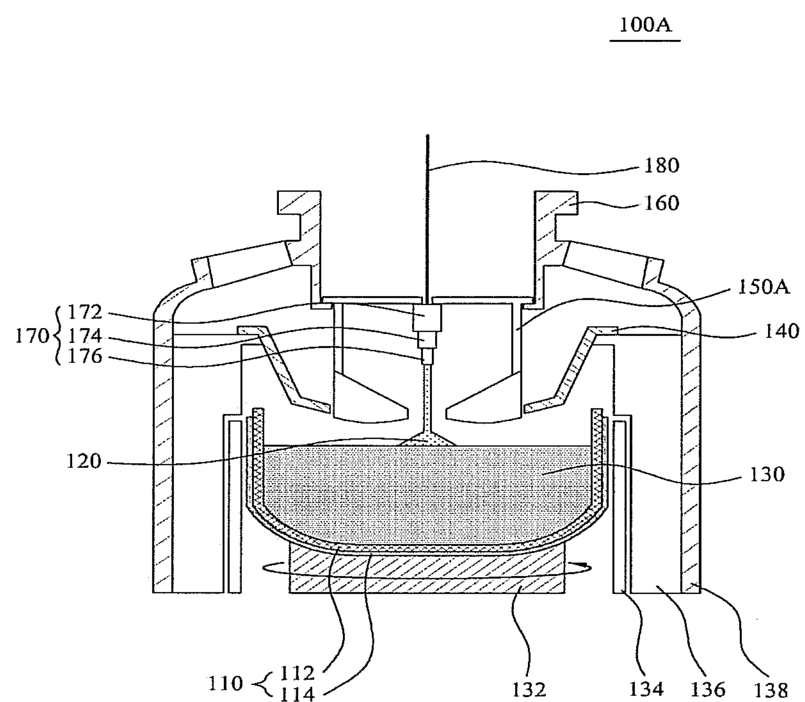
Figure 6G:
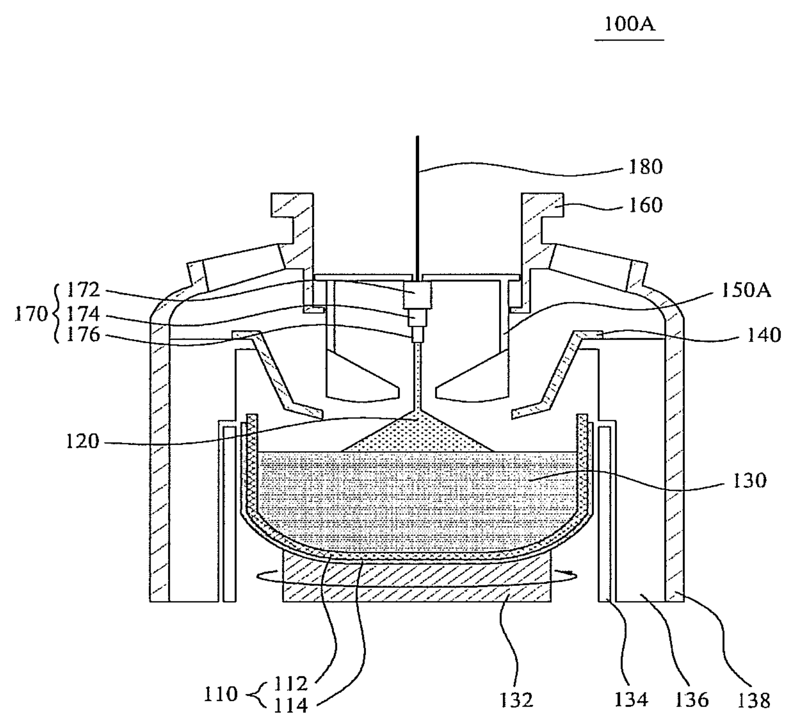
Figure 6H:
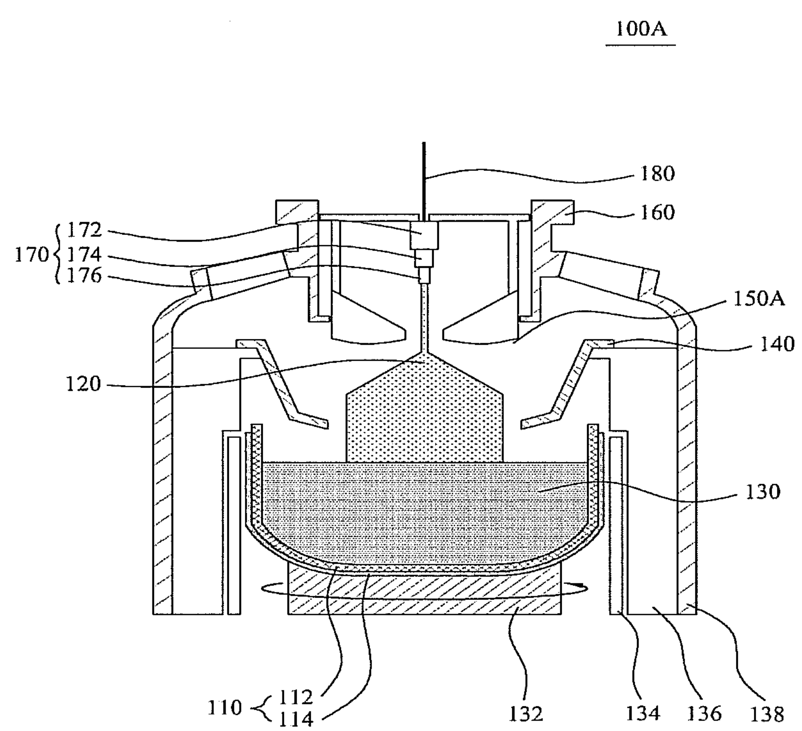

After growth of the neck portion in Operation 206, as illustrated in FIG. 6F to FIG. 6H, the controller 184 controls the pulling drive unit 182 to pull the seed crystal unit 170 and the neck cover 150A up together using the wire 180, enabling growth of a shoulder portion of a single-crystal ingot (Operation 208).

That is, after growth of the neck portion as illustrated in FIG. 6E, as illustrated in FIG. 6F, growth of the shoulder portion is initiated. In this case, a top surface of the seed crystal weight 172 is brought into contact with a bottom surface of the top portion 152.

Thereafter, as illustrated in FIG. 6G, while the seed crystal unit 170 is pulled up to continuously grow the shoulder portion, the neck cover 150A is simultaneously pulled up. Here, a pulling speed of both the seed crystal unit 170 and the neck cover 150A may be within a range of 0.3 mm/min to 1.0 mm/min. In addition, after growing the neck portion, as illustrated in FIG. 6F, to restrict fine vibration that may occur when both the seed crystal unit 170 and the neck cover 150A are pulled up simultaneously, the controller 184 controls a magnetic field generator (not shown) to apply a horizontal magnetic field of 1000 G or more, more particularly of 2000 G to 5000 G to the crucible 110.

Thereafter, as illustrated in FIG. 6H, as a diameter portion grows, the neck cover 150A is lifted to an original position thereof as illustrated in FIG. 6A and FIG. 6B by the seed crystal unit 170.

Figure 7:
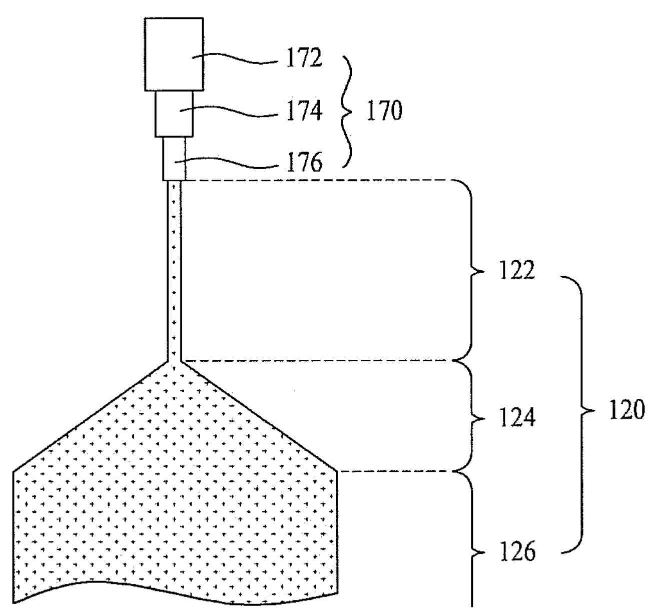
FIG. 7 is a sectional view of a single-crystal ingot according to an embodiment.

FIG. 7 is a sectional view of a single-crystal ingot according to an embodiment.

As described above, by performing the single-crystal ingot manufacturing method illustrated in FIG. 5 using the single-crystal ingot manufacturing apparatus 100A illustrated in FIG. 2, a single-crystal ingot 120 as illustrated in FIG. 7 may be grown.

Referring to FIG. 7, the single-crystal ingot 120 may include a neck portion 122, a shoulder portion 124, and a diameter portion (or body portion or a straight body) 126. The neck portion 122 may be grown below the seed crystal 176, the shoulder portion 124 may be grown under the neck portion 122, and the diameter portion 126 may be grown under the shoulder portion 124.

Figure 1:
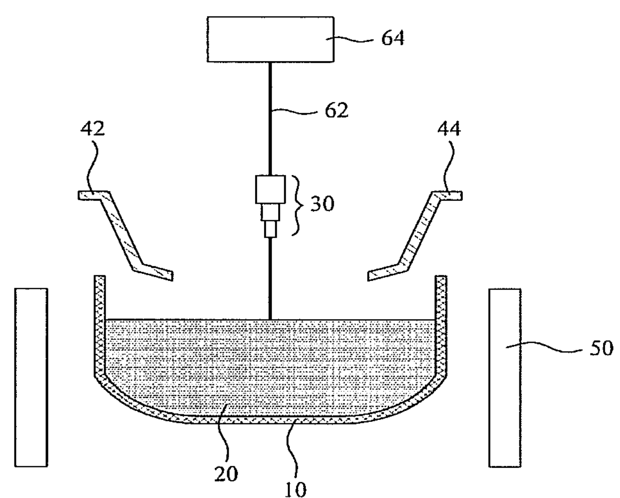
FIG. 1 is a view illustrating a conventional single-crystal ingot manufacturing apparatus.

Referring to FIG. 1, according to the related art, thermal shock occurs due to a temperature difference between the seed crystal 30 and the melt 20 while the seed crystal 30 is dipped in the melt 20, which may cause slip dislocation at the seed crystal 30.

On the other hand, according to the embodiment, as the seed crystal 176 encompassed by the neck cover 150A that is introduced into the opening 144 of the heat shield member 140 is kept warm, the seed crystal 176 is dipped in the melt 130 to enable growth of the neck portion 122. Accordingly, the temperature of the seed crystal 176 is increased, which may achieve remarkable reduction of thermal shock when the tip end of the seed crystal 176 comes into contact with a surface of the melt 130, thereby preventing occurrence of slip dislocation. In this way, the neck portion 122 of the single-crystal ingot 120 according to the embodiment is free from dislocation and may have a diameter of 5.5 mm or more.

Moreover, even if the single-crystal ingot 120 has a large diameter and high weight, according to the embodiment, there is no risk of damage to the neck portion 122 and consequently fall of the single-crystal ingot 120 because the neck portion 122 has a large diameter. For this reason, in the single-crystal ingot 120 of the embodiment, the diameter portion 126 may have a large diameter, for example, 300 mm or more.

Figure 8:
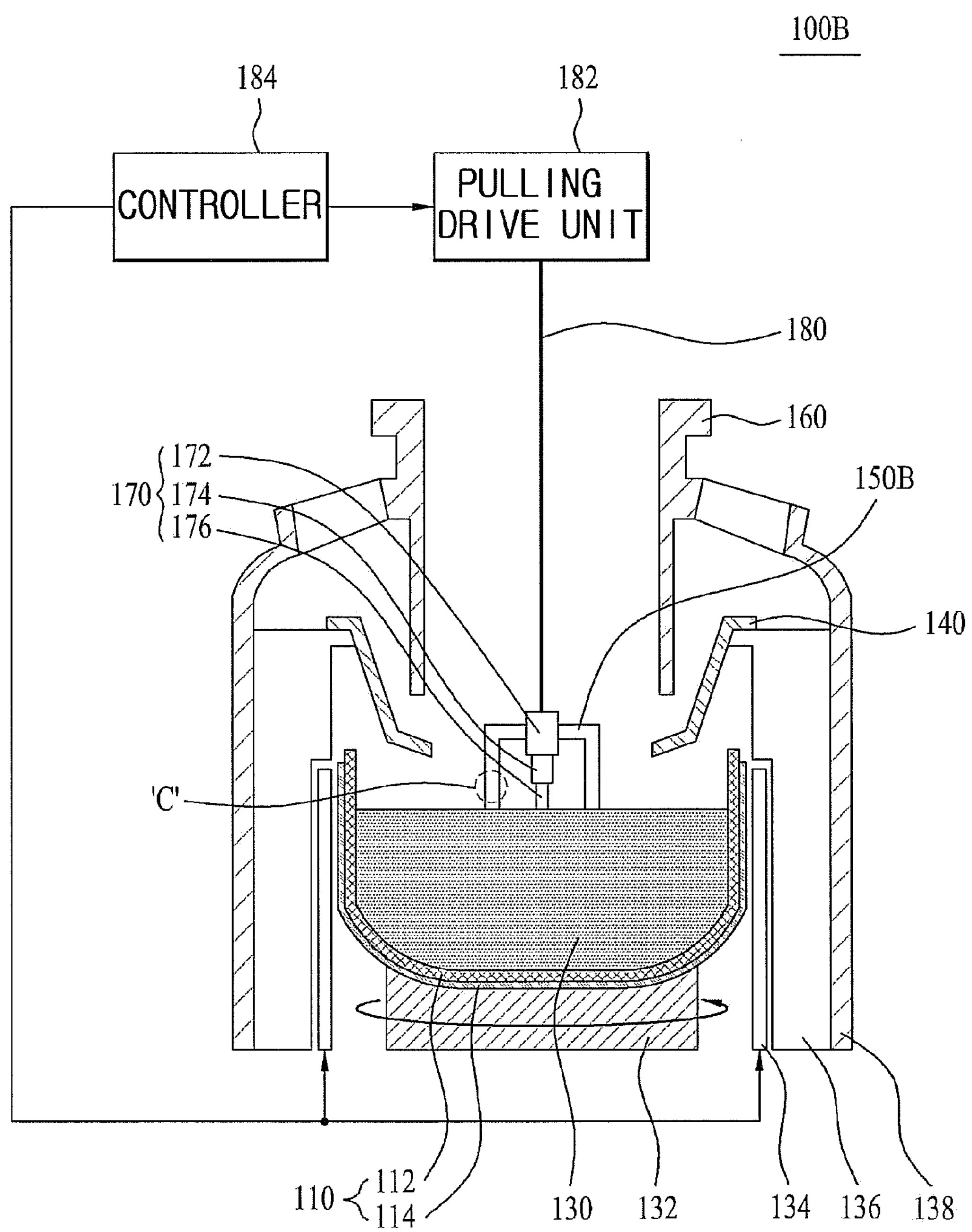
FIG. 8 is a view illustrating a single-crystal ingot manufacturing apparatus according to another embodiment.

FIG. 8 is a view illustrating a single-crystal ingot manufacturing apparatus 100B according to another embodiment.

Differently from the single-crystal ingot manufacturing apparatus 100A illustrated in FIG. 2, in the single-crystal ingot manufacturing apparatus 100B of FIG. 8, a neck cover 150B is not guided by the guide unit 160. Accordingly, the guide unit 160 illustrated in FIG. 8 is not provided with the stopper 164. In addition, differently from illustration of FIG. 2, the neck cover 150B illustrated in FIG. 8 is configured to encompass the seed crystal chuck 174 and the seed crystal 176, but is not configured to encompass the seed crystal weight 172. Aside from this point, the other configurations of the single-crystal ingot manufacturing apparatus 100B illustrated in FIG. 8 are equal to those of the single-crystal ingot manufacturing apparatus 100A illustrated in FIG. 2. Same parts are designated by the same reference numerals, and a detailed description thereof will be omitted herein.

A single-crystal ingot manufacturing method performed by the single-crystal ingot manufacturing apparatus 100B as illustrated in FIG. 8 will be described hereinafter with reference to FIG. 5.

In the single-crystal ingot manufacturing apparatus 100A illustrated in FIG. 2, the neck cover 150 is kept stationary after being moved by the predetermined range L, and only the seed crystal 176 is dipped in the melt 130 to enable growth of the neck portion 122 (Operation 206). In contrast, in the single-crystal ingot manufacturing apparatus 100B illustrated in FIG. 8, the neck cover 150B and the seed crystal 176 are simultaneously dipped in the melt 130 to grow the neck portion 122 (operation 206). Except for this, the single-crystal ingot manufacturing apparatus 100B illustrated in FIG. 8 performs the same single-crystal ingot manufacturing method as that of the single-crystal ingot manufacturing apparatus 100A illustrated in FIG. 2.

That is, the melt 130 is produced as described above (Operation 202). After Operation 202, the seed crystal 176 and the neck cover 150B are lowered together (Operation 204). After Operation 204, the seed crystal 176 is dipped in the melt 130, and thereafter the seed crystal 176 is pulled up to grow the neck portion 122 (Operation 206). Next, the seed crystal 176 and the neck cover 150B are pulled up together to sequentially grow the shoulder portion 124 and the diameter portion 126 (Operation 208).

Figure 9A:
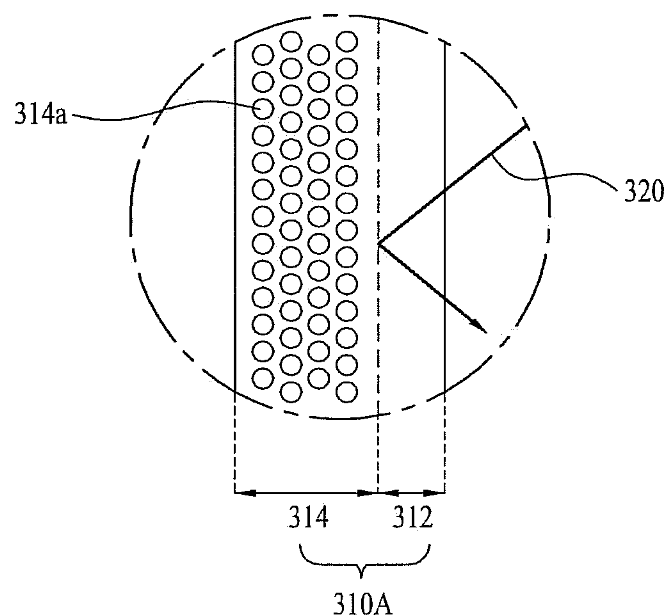
FIG. 9A to FIG. 9C are sectional views of neck covers according to various embodiments.
Figure 9B:
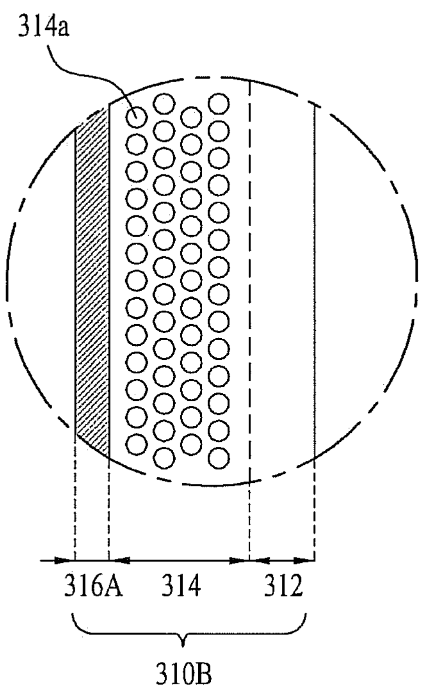
Figure 9C:
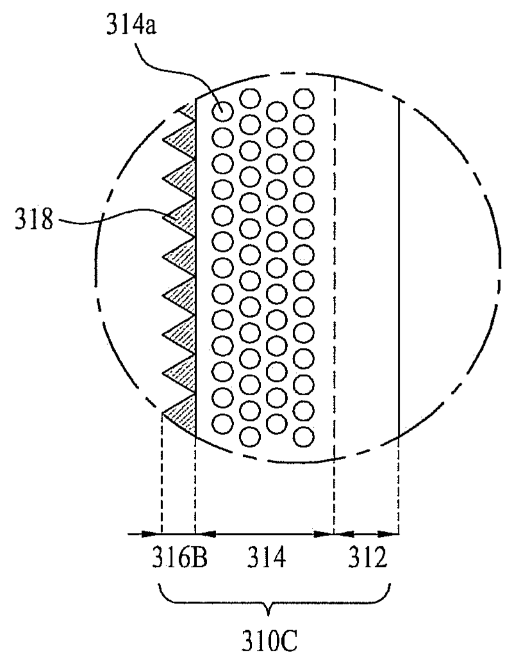

FIG. 9A to FIG. 9C are sectional views of neck covers 310A, 310B and 310C according to various embodiments.

The respective neck covers 310A, 310B and 310C illustrated in FIG. 9A to FIG. 9C correspond to enlarged sectional views of the portion ‘B’ or ‘C’ illustrated in FIG. 2, FIG. 3 or FIG. 8. That is, the neck covers 150A and 150B illustrated in FIG. 2 and FIG. 8 may be modified as illustrated in FIG. 9A to FIG. 9C.

Referring to FIG. 9A to FIG. 9C, the neck covers 310A, 310B and 310C may include at least one inner wall layer 312 and at least one outer wall layer 314. Although only one inner wall layer 312 and only one outer wall layer 314 are illustrated in FIG. 9A to FIG. 9C, the embodiments are not limited thereto, and of course, a plurality of inner-wall layers 312 and outer-wall layers 314 may be provided.

The at least one inner wall layer 312 may encompass the seed crystal unit 170 illustrated in FIG. 2 or may encompass the seed crystal chuck 174 and the seed crystal 176 illustrated in FIG. 8. The at least one outer wall layer 314 is placed around the at least one inner wall layer 312, and serves to prevent heat emitted from the interior of the neck cover 310A; 310B; 310C from being transferred to the outside of the neck cover 310A; 310B; 310C.

A void ratio of the outer wall layer 314 illustrated in FIG. 9A to FIG. 9C may be greater than a void ratio of the inner wall layer 312. In addition, the outer wall layer 314 may have bubbles 314*a*, whereas the inner wall layer 312 may have no bubbles 314*a*. Each of the inner wall layer 312 and the outer wall layer 314 may be formed of SiO2.

Figure 10:
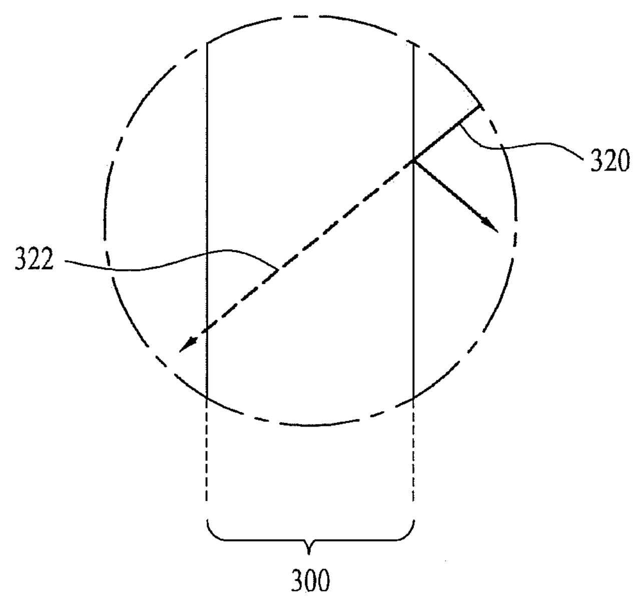
FIG. 10 is a sectional view of a single-layer neck cover.

FIG. 10 is a sectional view of a single-layer neck cover 300.

If the neck cover 150A; 150B illustrated in FIG. 2 or FIG. 8 is constructed by a single layer 300 as illustrated in FIG. 10, heat 320 emitted from the interior of the neck cover 150A; 150B is discharged outward, as designated by a dotted line 322, with passing through the single layer 300, which may cause heat loss.

On the other hand, if the neck cover 150A; 150B illustrated in FIG. 2 or FIG. 8 is constructed by a plurality of layers, i.e. the outer wall layer 314 and the inner wall layer 312 as illustrated in FIG. 9A to FIG. 9C, the heat 320 emitted from the interior of the neck cover 310A; 310B; 310C may be reflected inward rather than penetrating the outer-wall layer 314, which may prevent heat loss.

In general, as a melt gap corresponding to a distance between the heat shield member 140 and the melt 130 increases, the quantity of radiant heat transferred to the seed crystal 176 and the neck portion 122 increases. Thus, to ensure that the neck cover 150A; 150B absorbs the radiant heat, as illustrated in FIG. 9B and FIG. 9C, the neck cover 310B; 310C may further include a coating layer 316A; 316B. Although FIG. 9B and FIG. 9C illustrate only one coating layer 316A; 316B, the embodiments are not limited thereto, and of course a plurality of coating layers 316A and 316B may be placed around the outer wall layer 314.

The coating layer 316A; 316B may be coated over the outer wall layer 314. In this case, the coating layer 316B may have an outer surface having roughness 318 as illustrated in FIG. 9C to absorb a greater amount of radiant heat. The coating layer 316A; 316B may be formed of a paint that exhibits heat-resistance at a high temperature and is less susceptible to contamination. For example, the coating layer 316A; 316B may include SiC.

As described above, if the neck cover 150A; 150B illustrated in FIG. 2 or FIG. 8 is modified as illustrated in FIG. 9A to FIG. 9C, an interface between the seed crystal 176 and the melt 130 and the seed crystal 176 may be more and more kept warm during a necking operation for growth of the neck portion 122, thereby alleviating thermal shock as much, and consequently more reliably ensure dislocation-free of the neck portion 122 and growth of a correspondingly greater diameter of the neck portion 122.

As is apparent from the above description, in a single-crystal ingot and an apparatus and a method for manufacturing the single-crystal ingot according to the embodiments, by dipping a seed crystal in a melt in a state in which the seed crystal is encompassed by a neck cover that is introduced into an opening of a heat shield member and thus the seed crystal is kept warm, a single-crystal ingot consisting of a dislocation-free neck portion having a large diameter of 5.5 mm or more and a diameter portion having a large diameter of 300 mm or more may be grown. In addition, owing to using the neck cover consisting of a plurality of layers, it is possible to ensure that the seed crystal is more reliably kept warm during the forming the neck portion, which results in growth of a dislocation-free neck portion having an increased diameter of a single-crystal ingot.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A single-crystal ingot manufacturing apparatus, comprising:

a crucible in which a melt is accommodated;

a heater configured to heat the crucible;

a heat shield member configured to shield radiant heat from the heater and the melt; and a neck cover configured to encompass a seed crystal unit above the crucible with being introduced into an opening of the heat shield member, the radiant heat being not shielded in the opening, the neck cover being vertically moved in linkage to vertical movement of the seed crystal unit within a predetermined range, wherein the neck cover comprises:

at least one inner wall layer; and at least one outer wall layer placed on the at least one inner wall layer to prevent transmission of heat emitted from the interior of the neck cover.

2. The apparatus according to claim 1, further comprising a guide unit to guide a vertical movement path of the neck cover within the predetermined range.

3. The apparatus according to claim 2, wherein both ends of the guide unit define the predetermined range, and the guide unit has a stopper protruding inward from one of both ends thereof that is closer to the crucible, the stopper serving to restrict the vertical movement path.

4. The apparatus according to claim 3, wherein the neck cover comprises:

a top portion consisting of a first region and a second region, wherein the first region is supported by the seed crystal unit and has a through-hole, through which a wire connected to the seed crystal unit passes, and the second region protrudes outward from an edge of the top portion so as to be caught by the stopper;

a lateral portion extending from the top portion; and a bottom portion protruding inward from the lateral portion and configured to encompass the seed crystal unit, the bottom portion defining an opening for entrance/exit of the seed crystal unit.

5. The apparatus according to claim 4, wherein the bottom portion of the neck cover and the heat shield member form a heat shield member when the protrusion of the second region is caught by the stopper.

6. The apparatus according to claim 5, further comprising a controller to control growth of a neck portion of a single-crystal ingot by dipping the seed crystal unit in the melt during formation of the heat shield member.

7. The apparatus according to claim 4, wherein the top portion and the lateral portion of the neck cover are formed of a metal or metal oxide.

8. The apparatus according to claim 4, wherein the bottom portion of the neck cover is formed of a material having an M/I (monomer to initiator) of 1.0 ppma or less.

9. The apparatus according to claim 1, wherein a void ratio of the at least one outer wall layer is greater than a void ratio of the at least one inner wall layer.

10. The apparatus according to claim 1, wherein the at least one outer wall layer includes bubbles, and the at least one inner wall layer includes no bubbles.

11. The apparatus according to claim 1, wherein each of the at least one inner wall layer and the at least one outer wall layer is formed of SiO2.

12. A single-crystal ingot manufacturing apparatus, comprising:

a crucible in which a melt is accommodated;

a heater configured to heat the crucible;

a heat shield member configured to shield radiant heat from the heater and the melt; and a neck cover configured to encompass a seed crystal above the crucible with being introduced into an opening of the heat shield member, the radiant heat being not shielded in the opening, wherein the neck cover includes:

at least one inner wall layer; and at least one outer wall layer placed on the at least one inner wall layer to prevent transmission of heat emitted from the interior of the neck cover.

* * * * *

UNITED STATES PATENT AND TRADEMARK OFFICE

CERTIFICATE OF CORRECTION

PATENT NO. : 9,534,314 B2
APPLICATION NO. : 13/914927
DATED : January 3, 2017
INVENTOR(S) : Il Soo Choi et al.

It is certified that error appears in the above-identified patent and that said Letters Patent is hereby corrected as shown below:

On the Title Page

(30) Foreign Application Priority Data reads:
Jan. 23, 2013 (KR).................................. 10-2012-0007360
Jan. 23, 2013 (KR).................................. 10-2012-0007361

Should read:
Jan. 23, 2013 (KR).................................. 10-2013-0007360
Jan. 23, 2013 (KR).................................. 10-2013-0007361

Signed and Sealed this
Ninth Day of May, 2017

Michelle K. Lee

Michelle K. Lee
*Director of the United States Patent and Trademark Office*